(12) United States Patent
Lin et al.

(10) Patent No.: US 12,369,325 B2
(45) Date of Patent: Jul. 22, 2025

(54) GATE-LAST TRI-GATE FeFET

(71) Applicant: Taiwan Semiconductor Manufacturing Company, Ltd., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 514 days.

(21) Appl. No.: 17/894,597

(22) Filed: Aug. 24, 2022

(65) Prior Publication Data

US 2023/0413572 A1    Dec. 21, 2023

Related U.S. Application Data

(60) Provisional application No. 63/352,294, filed on Jun. 15, 2022.

(51) Int. Cl.
*H10B 51/30* (2023.01)

(52) U.S. Cl.
CPC .................................. *H10B 51/30* (2023.02)

(58) Field of Classification Search
CPC ...................................................... H10B 51/30
USPC .......................................................... 257/43
See application file for complete search history.

(56) References Cited

U.S. PATENT DOCUMENTS

| | | |
|---|---|---|
| 11,404,570 B2 | 8/2022 | Chang et al. |
| 2004/0191532 A1 | 9/2004 | Gabric et al. |
| 2010/0243994 A1* | 9/2010 | Yoon ..................... H10D 30/701 257/295 |
| 2021/0408043 A1 | 12/2021 | Yeong et al. |
| 2022/0059702 A1 | 2/2022 | Naylor et al. |
| 2022/0165871 A1 | 5/2022 | Chung et al. |
| 2023/0081793 A1* | 3/2023 | Song ..................... H10D 64/258 257/330 |
| 2023/0411521 A1* | 12/2023 | Ito ........................ H10D 86/423 |

FOREIGN PATENT DOCUMENTS

| | | |
|---|---|---|
| KR | 20140063445 A | 5/2014 |
| KR | 20220001430 A | 1/2022 |
| TW | 202218135 A | 5/2022 |

OTHER PUBLICATIONS

Sheng-Hsiung Wang et al., Standard Cell Design with Dummy Padding, U.S. Appl. No. 17/749,842, filed May 20, 2022, Assignee: Taiwan Semiconductor Manufacturing Company, 29 pages specification, 21 pages drawings.

* cited by examiner

*Primary Examiner* — Monica D Harrison
(74) *Attorney, Agent, or Firm* — HAYNES AND BOONE, LLP

(57) ABSTRACT

A semiconductor structure includes an isolation layer; first and second source/drain (S/D) metal electrodes over the isolation layer; a metal gate disposed laterally between the first and the second S/D metal electrodes; a ferroelectric layer on a bottom surface and sidewall surfaces of the metal gate; and an oxide semiconductor layer. The oxide semiconductor layer includes a first portion under the first and the second S/D metal electrodes; a second portion under the ferroelectric layer and being thicker than the first portion; third portions above the first and the second S/D metal electrodes, respectively; and fourth portions on sidewalls of the first and the second S/D metal electrodes, respectively, and connecting the third portions to the second portion.

20 Claims, 17 Drawing Sheets

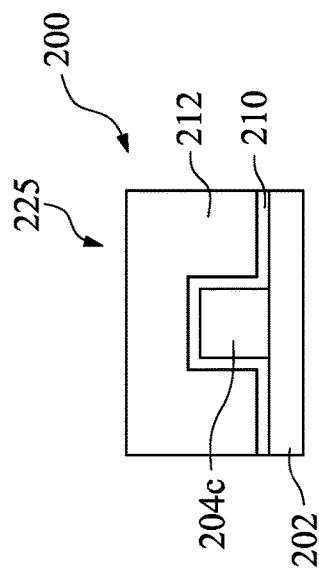
Fig. 6C-1
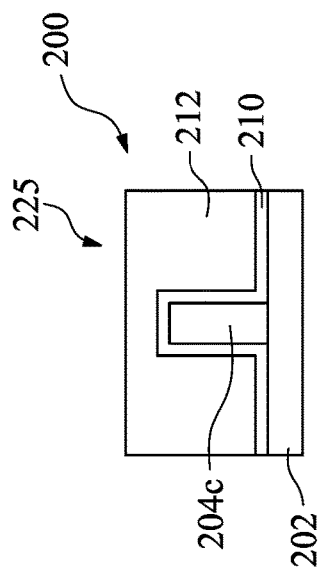
Fig. 6C-2
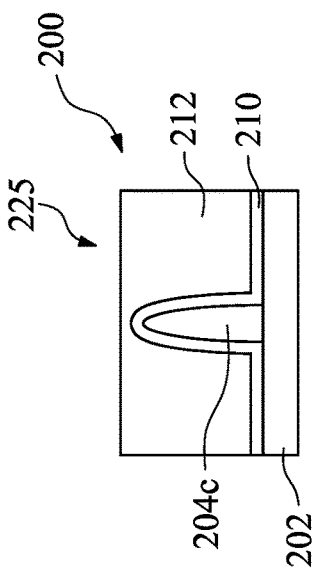
Fig. 6C-3
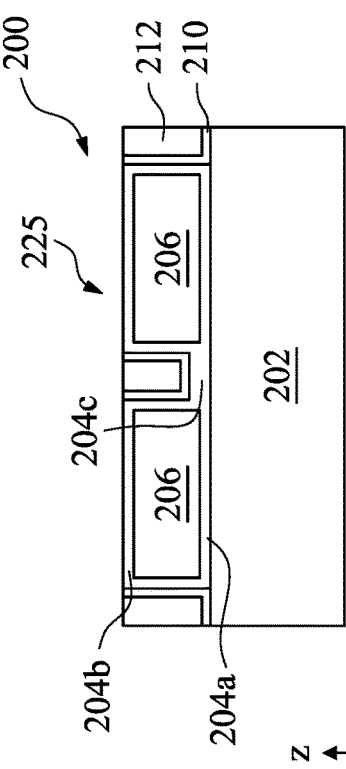
Fig. 6A
Fig. 6B

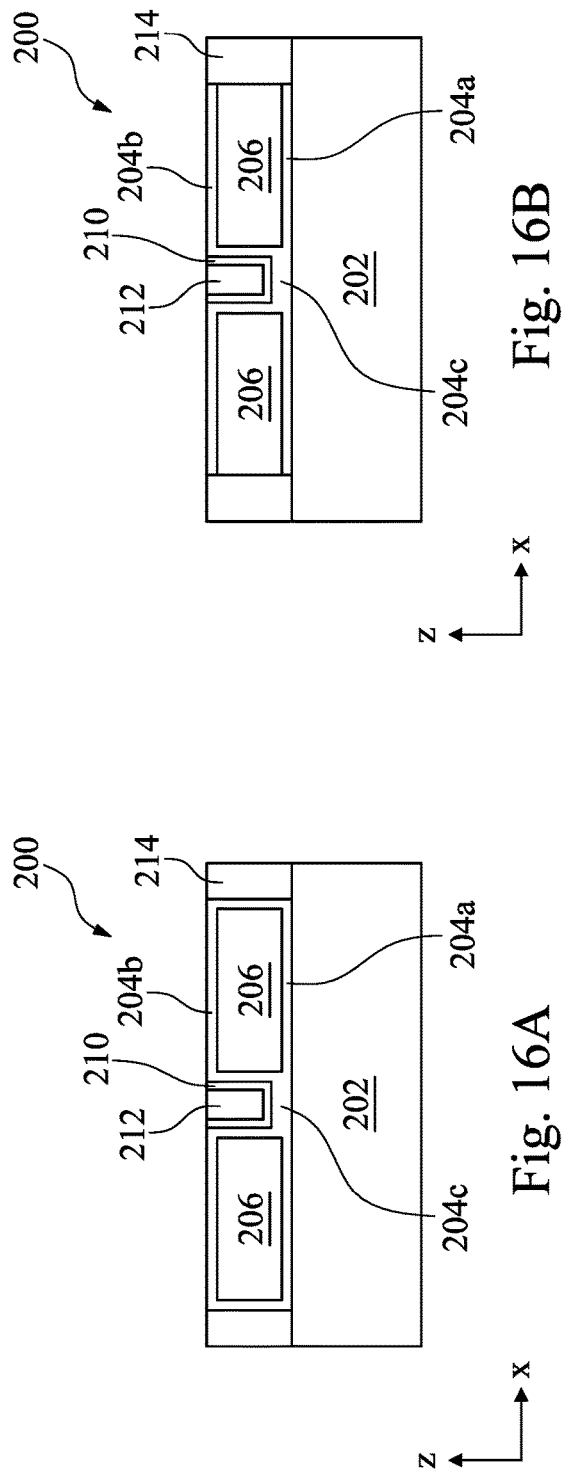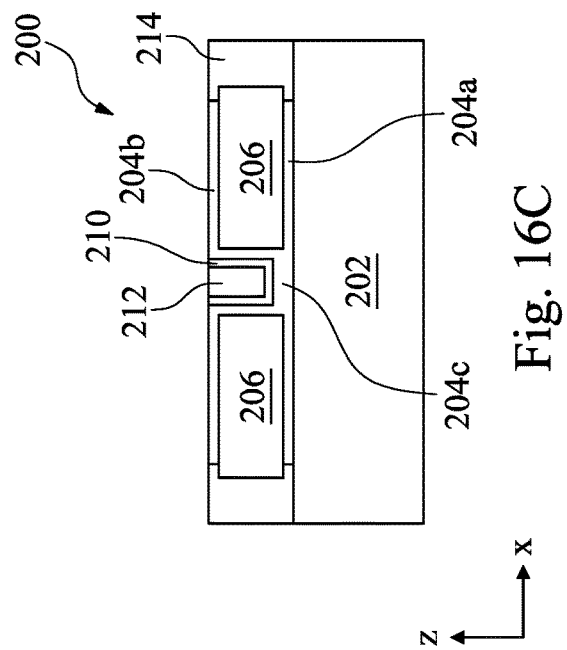

GATE-LAST TRI-GATE FeFET

PRIORITY

This application claims the benefits of and priority to U.S. Provisional Application Ser. No. 63/352,294, filed Jun. 15, 2022, incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements.

One area of improvements is in ferroelectric (FE) field effect transistor (FET) (or FeFET) manufacturing processes. FeFET is an attractive candidate to be integrated to CMOS back-end-of-line (BEOL) processes for computing-in-memory and other applications. Existing approaches sometimes suffer from low contact area between source/drain metal to oxide semiconductor channel, low effective channel width, and negative impacts on threshold voltage by thermal processes after gate formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, and 8A illustrate perspective views of a semiconductor structure having FeFET, in portion, according to various aspects of the present disclosure.

FIGS. 2B, 3B, 4B, 5B, 6B, 7B, and 8B illustrate cross-sectional views of the semiconductor structure in FIGS. 2A, 3A, 4A, 5A, 6A, 7A, and 8A, respectively, in portion, along the "B-B" line in the respective figures, according to various aspects of the present disclosure.

FIGS. 6C-1, 6C-2, and 6C-3 illustrate cross-sectional views of the semiconductor structure in FIG. 6A, in portion, along the "C-C" line in FIG. 6A, according to various aspects of the present disclosure.

FIGS. 9B-1, 9B-2, and 9B-3 illustrate cross-sectional views of the semiconductor structure in FIG. 9A, in portion, along the "B-B" line in FIG. 9A, according to various aspects of the present disclosure.

FIGS. 16A, 16B, and 16C illustrate cross-sectional views of a semiconductor structure having FeFET, in portion, along the "B-B" line in FIG. 6A, according to various aspects of the present disclosure.

DETAILED DESCRIPTION

Figure 1:
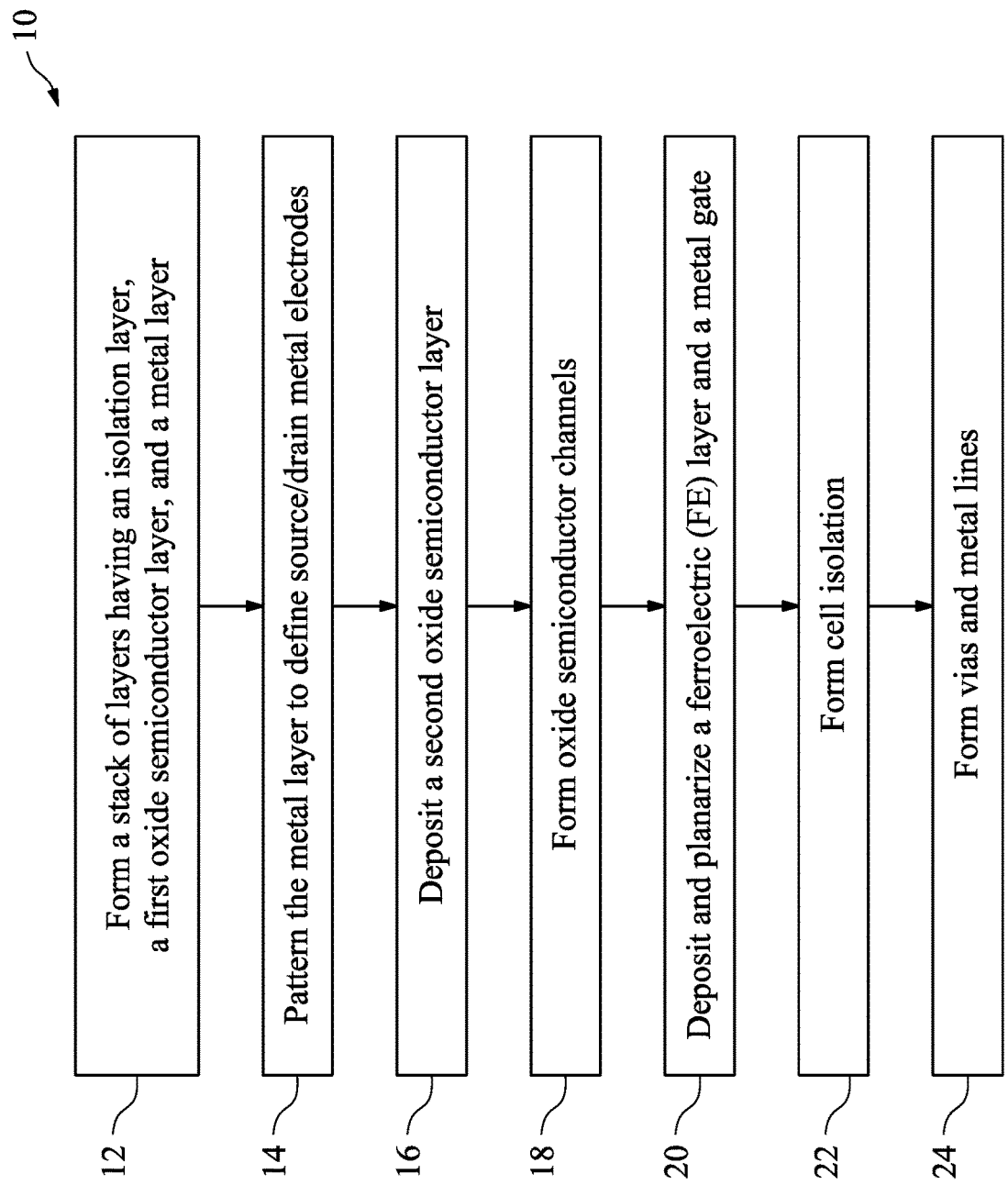
FIG. 1 shows a flow chart of a method of forming a semiconductor structure having FeFET, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/-10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates generally to semiconductor fabrication processes and the structures thereof, and more particularly to processes of forming a semiconductor device having FeFET (or FEFET). The disclosed semiconductor device can be a standalone memory IC having memory cells formed from FeFET or be integrated with MOSFETs (such as CMOSFETs, FinFETs, gate-all-around (GAA) transistors such as nanowire FETs and nanosheet FETs, or other types of multi-gate FETs) in an IC. In an embodiment, the disclosed process employs a gate-last process in forming FeFETs where the gate of an FeFET is formed after the channel, FET layer, and source/drain (S/D) electrodes of the FeFET are formed. By using a gate-last process, the disclosed process reduces thermal impacts on FeFET threshold voltage (Vt) and improves the reliability of the manufacturing processes and the resultant semiconductor structure. Also, embodiments of the present disclosure use a tri-gate structure (i.e., having a gate on top surface and two sidewall surfaces of the FeFET channel) in FeFETs, which increases effective channel width and enhances FeFET's current drive and/or source capability. In the present disclosure, source/drain (or S/D) may refer to a source or a drain, individually or collectively dependent upon the context. These and other aspects of the present disclosure are further described by referring to the accompanied figures.

FIG. 1 is a flow chart of a method 10 for fabricating a semiconductor device according to various aspects of the present disclosure. Additional processing is contemplated by the present disclosure. Additional operations can be provided before, during, and after method 10, and some of the operations described can be moved, replaced, or eliminated for additional embodiments of method 10. Method 10 is described below in conjunction with FIGS. 2A-8B that illustrate various perspective and cross-sectional views of a semiconductor structure (or semiconductor device) 200 at various steps of fabrication according to the method 10, in accordance with some embodiments. In some embodiments, the semiconductor structure 200 is a standalone memory device. In some embodiments, the semiconductor structure 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the semiconductor structure 200 is implemented at the back-end-of-line (BEOL) of an IC and above CMOS transistors that are implemented at the front-end-of-line (FEOL) of the IC. FIGS. 2A-8B have been simplified for the sake of clarity to better understand the inventive concepts of the present disclosure. Additional features can be added in the semiconductor structure 200, and some of the features described below can be replaced, modified, or eliminated in other embodiments of the semiconductor structure 200.

Figure 2B:
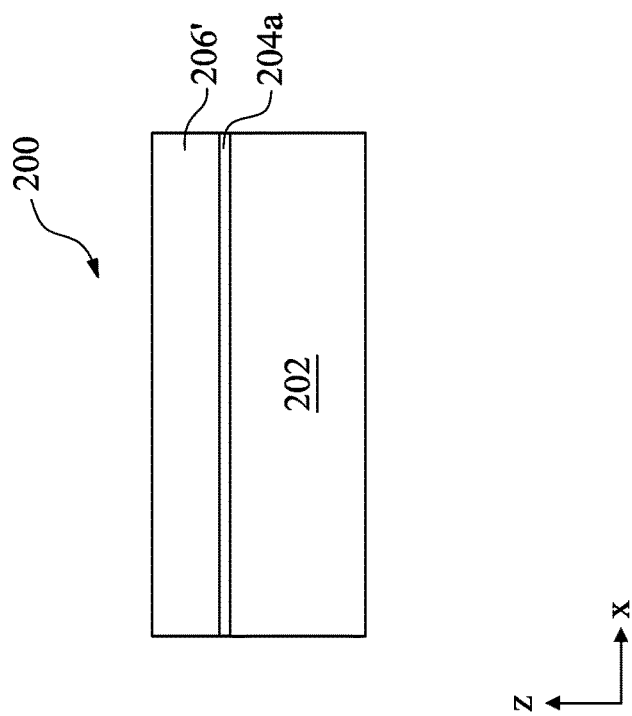
Figure 2A:
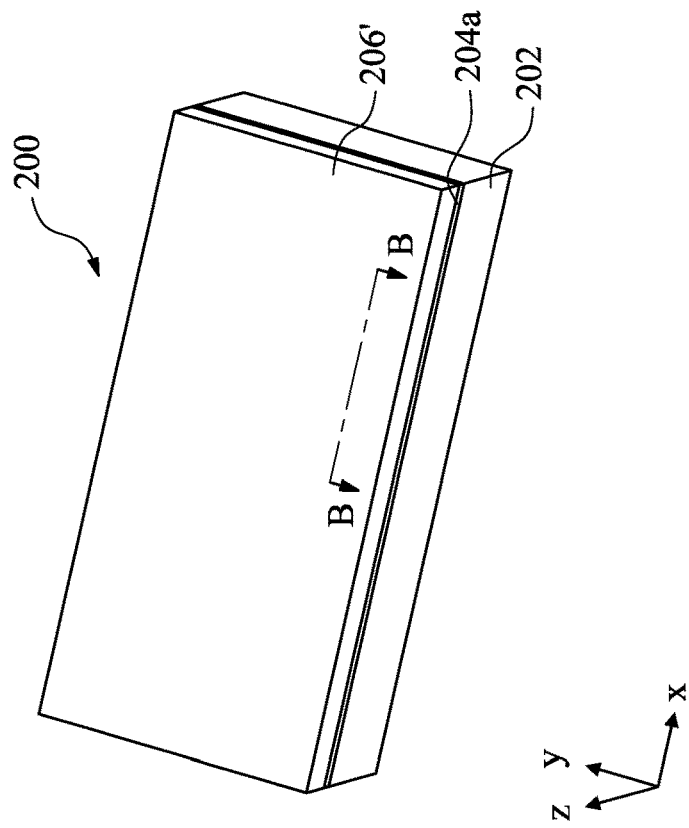

At operation 12, the method 10 (FIG. 1A) forms, provides, or is provided with a stack of layers that are part of the semiconductor structure 200. Referring to FIGS. 2A-2B, in the present embodiment, the stack of layers includes an isolation layer 202, a semiconductor layer 204a over the isolation layer 202, and a metal layer 206' over the semiconductor layer 204a. The stack of layers may include other layer(s) not depicted in FIGS. 2A-2B.

In an embodiment, the isolation layer 202 includes a dielectric material such as silicon nitride ($Si_3N_4$), silicon oxide ($SiO_2$), other suitable dielectric material, or a combination thereof. The isolation layer 202 may have a thickness (along the "z" direction) in a range of about 10 nm to about 100 nm in some embodiments. The isolation layer 202 may be formed by chemical vapor deposition (CVD), physical vapor deposition (PVD), atomic layer deposition (ALD), or other suitable methods.

In some embodiments, the semiconductor layer 204a includes an n-type oxide semiconductor such as amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO), other suitable n-type oxide semiconductor, or a combination thereof. In some embodiments, the semiconductor layer 204a includes a p-type oxide semiconductor such as tin oxide ($SnO_x$), copper oxide ($Cu_xO$), nickel oxide ($NiO_x$), other suitable p-type oxide semiconductor, or a combination thereof. The semiconductor layer 204a may have a thickness (along the "z" direction) in a range of about 10 nm to about 60 nm in some embodiments. The semiconductor layer 204a may be formed by CVD, PVD, ALD, or other suitable methods.

In an embodiment, the metal layer 206' includes a conductive material such as Mo, Ti, Pd, W, Co, Cr, Cu, Ni, Ta, Pt, Au, Al, TiW, TiN, TaN, WN, WCN, other suitable conductive materials, or a combination thereof. The metal layer 206' may have a thickness (along the "z" direction) in a range of about 10 nm to about 60 nm in some embodiments. The metal layer 206' may be formed by CVD, PVD, ALD, plating, or other suitable methods. The method 10 may perform annealing process(es) after depositing each of the layers 202, 204a, and 206'.

Figure 3B:
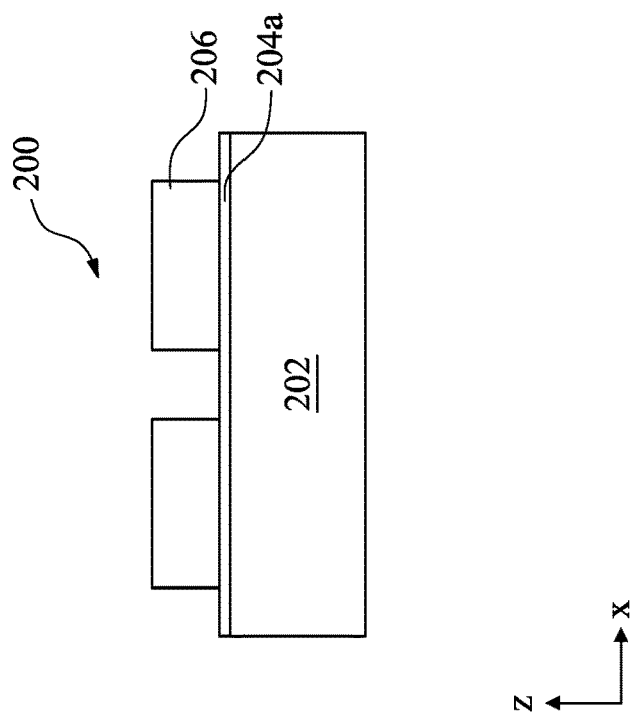
Figure 3A:
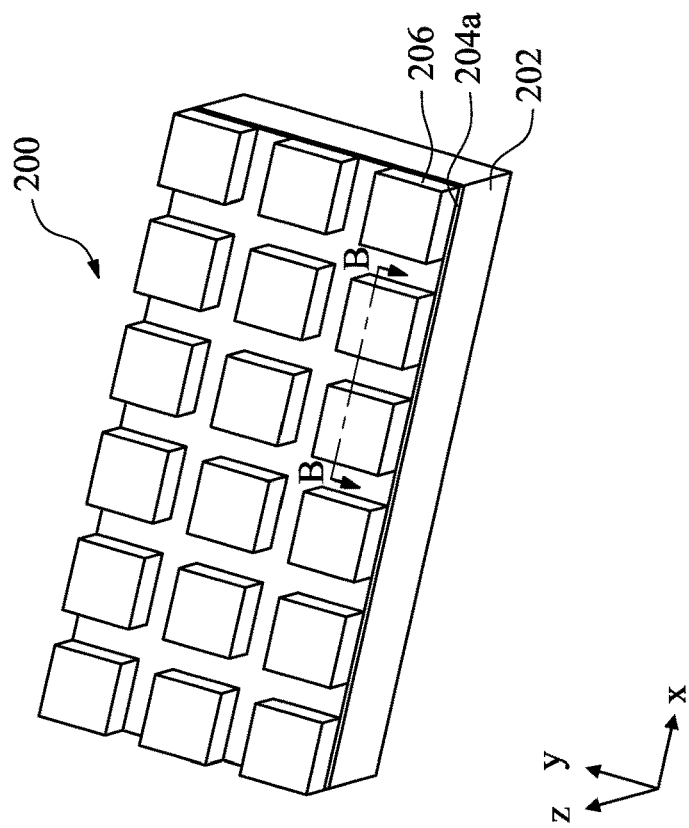

At operation 14, the method 10 (FIG. 1A) patterns the metal layer 206' to form S/D metal electrodes 206 (also referred to as S/D 206), such as shown in FIGS. 3A-3B. In an embodiment, operation 14 includes performing a photolithography process to form an etch mask over the semiconductor structure 200. The photolithography process may include forming a resist layer over the semiconductor structure 200 (e.g., by spin coating), performing a pre-exposure baking process, performing an exposure process using a photomask, performing a post-exposure baking process, and developing the exposed resist layer in a developer solution. After development, the patterned resist layer includes a resist pattern that corresponds to the photomask, where the resist pattern provides openings corresponding to the gaps between adjacent S/D metal electrodes 206 in FIG. 3A, while covering the rest of the semiconductor structure 200. Alternatively, the exposure process can be implemented or replaced by other methods, such as maskless lithography, e-beam writing, ion-beam writing, or combinations thereof. After the etch mask is formed, operation 14 applies one or more etching processes that selectively etch the metal layer 206' with minimal (to no) etching of the semiconductor layer 204a, thereby forming the S/D metal electrodes 206. In an embodiment, the various etching processes may include dry etching, wet etching, reactive ion etching (RIE), and/or other suitable processes. After the etching is finished, the etch mask is removed. The method may further perform a cleaning process.

Figure 4B:
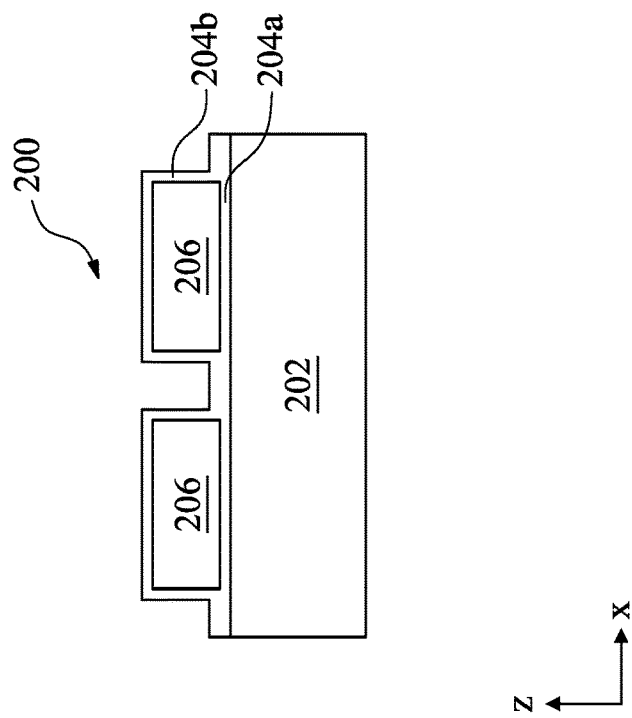
Figure 4A:
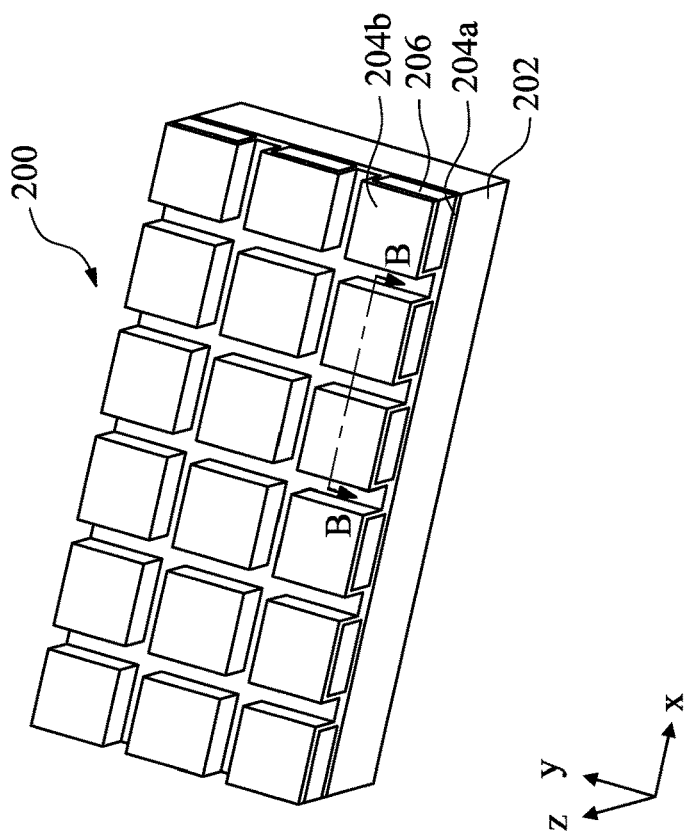

At operation 16, the method 10 (FIG. 1A) deposits another semiconductor layer 204b over the S/D metal electrodes 206 and the semiconductor layer 204a, such as shown in FIGS. 4A-4B. As depicted, the semiconductor layer 204b is deposited on top and sidewall surfaces of the S/D metal electrodes 206 and on the top surface of the semiconductor layer 204a. In an embodiment, the semiconductor layer 204b has about the same thickness on the various surfaces that it is deposited on, i.e., the semiconductor layer 204b is conformal or substantially conformal. In some embodiments, the semiconductor layer 204b includes an n-type oxide semiconductor such as a-IWO, a-IZO, a-IWZO, a-ITZO, a-ITO, a-InO, other suitable n-type oxide semiconductor, or a combination thereof. In some embodiments, the semiconductor layer 204b includes a p-type oxide semiconductor such as $SnO_x$, $Cu_xO$, $NiO_x$, other suitable p-type oxide semiconductor, or a combination thereof. In an embodiment, the semiconductor layers 204b and 204a include the same semiconductor material. In an alternative embodiment, the semiconductor layers 204b and 204a include different semiconductor materials but are of the same type (n-type or p-type). The semiconductor layer 204b may have a thickness (along the "z" direction) in a range of about 10 nm to about 60 nm in some embodiments. In an embodiment, the semiconductor layers 204b and 204a have about the same thickness. The method 10 may perform annealing process (es) after depositing the semiconductor layer 204b.

Figure 5B:
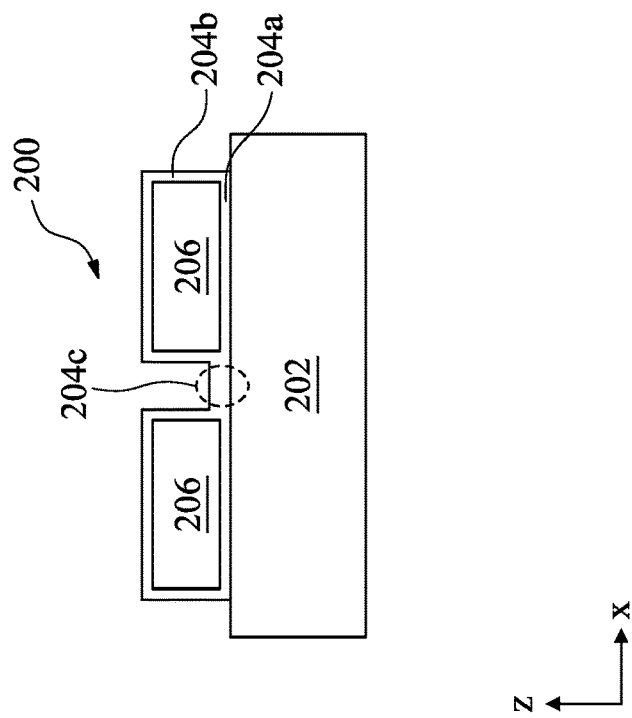
Figure 5A:
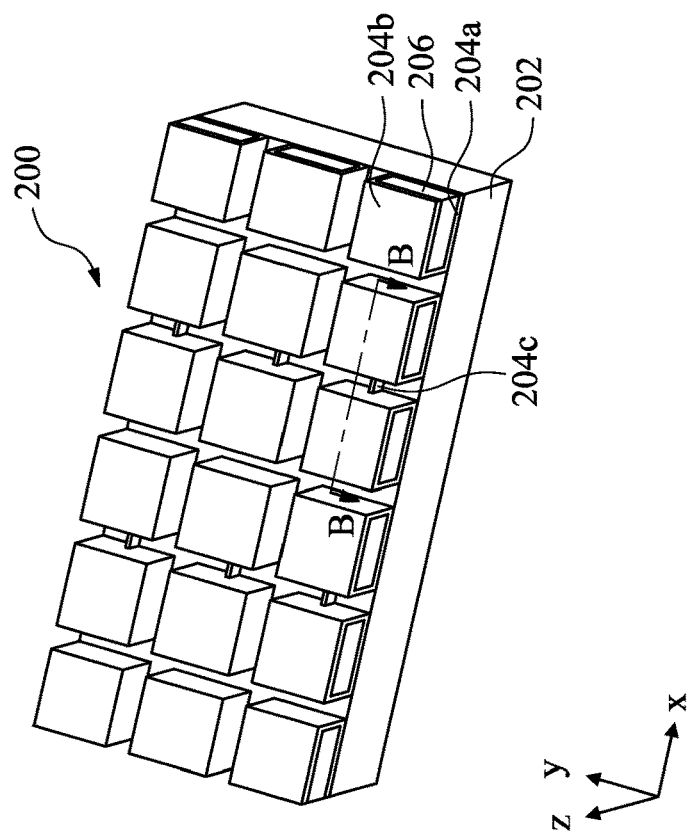

At operation 18, the method 10 (FIG. 1A) patterns the semiconductor layers 204b and 204a to form oxide semiconductor channels 204c (also referred to as channels 204c), such as shown in FIGS. 5A-5B. In an embodiment, operation 18 includes performing a photolithography process to form an etch mask over the semiconductor structure 200, like that discussed above with reference to operation 14. The etch mask covers the portions of the semiconductor layer 204b on the top and sidewall surfaces of the S/D metal electrodes 206 and the portions of the semiconductor layer 204b that are between certain S/D metal electrodes 206 and correspond to channels of FeFET, while exposing other portions of the semiconductor layer 204b. After the etch mask is formed, operation 18 applies one or more etching processes that selectively etch the semiconductor layers 204b and 204a with minimal (to no) etching of the isolation layer 202. In an embodiment, the various etching processes may include dry etching, wet etching, reactive ion etching, and/or other suitable processes. After the etching is finished, the etch mask is removed.

As shown in FIGS. 5A-5B, each channel 204c is disposed between two S/D metal electrodes 206 and connects the two S/D metal electrodes 206 through the portions of the semiconductor layer 204b on sidewalls of the S/D metal electrodes 206. Further, each channel 204c includes a portion of the semiconductor layer 204b directly on a portion of the semiconductor layer 204a. Therefore, the thickness of the channel 204c is about equal to the thickness of the semiconductor layer 204b plus the thickness of the semiconductor layer 204a. Furthermore, the portions of the semiconductor layer 204a that are directly under the S/D metal electrodes 206 remain in the semiconductor structure 200, while other portions (except those in the channels 204c) are removed. Still further, the portions of the semiconductor layer 204b that are directly above the S/D metal electrodes 206 and on sidewalls of the S/D metal electrodes 206 remain in the semiconductor structure 200, while other portions (except those in the channels 204c) are removed. Portions of the top surface of the isolation layer 202 is exposed. In the embodiment shown in FIGS. 5A-5B, each S/D metal electrode 206 is fully wrapped around by a combination of the semiconductor layer 204a (under the S/D metal electrode 206) and the semiconductor layer 204b (on top and sidewalls of the S/D metal electrode 206). This greatly increases the contact area between the S/D metal electrodes 206 and the semiconductor layers 204a and 204b, which also increases the contact area between the S/D metal electrodes 206 and the channels 204c and reduces contact resistance between the S/D metal electrodes 206 and the channels 204c. The reduced contact resistance advantageously results in increased current drive or source capability of the FeFET 225 (FIG. 6B) to be formed.

At operation 20, the method 10 (FIG. 1A) deposits an FE layer 210 over the isolation layer 202, the semiconductor layer 204b, and the channels 204c. Subsequently, the method 10 at operation 20 deposits a metal layer 212 over the FE layer 210 and performs a planarization process to the metal layer 212 and the FE layer 210. The resultant structure is shown in FIGS. 6A, 6B, 6C-1, 6C-2, and 6C-3, according to some embodiments. FIGS. 6C-1, 6C-2, and 6C-3 illustrate embodiments of the semiconductor structure 200 with channel 204c being of different cross-sectional shapes.

In some embodiments, the FE layer 210 includes $Hf_{1-x}Zr_xO_2$, $BaMgF_4$, $BaTiO_3$—$PbZrO$, $(Ba,Sr)TiO_3$, $Bi_4Ti_3O_{12}$, $LiNbO_3$, $LiTaO_3$, $(Pb,La)TiO_3$, $(Pb,La)(Zr,Ti)O_3$, $Pb(Zr,Ti)O_3$, $SrBi_2Ta_2O_9$, $Bi_{4-x}La_xTi_3O_{12}$ (BLT), $BiFeO_3$, $YMnO_3$, $YbMnO_3$, $BiMnO_3$, $Pb(Fe_{0.5}W_{0.5})_3$, $HfO_2$, or other suitable FE materials. The FE layer 210 may have a thickness in a range of about 5 nm to about 30 nm in some embodiments. The FE layer 210 may be deposited using CVD, PVD, ALD, or other suitable methods. In an embodiment, the FE layer 210 is deposited with uniform or substantially uniform thickness on the surfaces of the isolation layer 202, the semiconductor layer 204b, and the channels 204c. As shown in FIGS. 6C-1, 6C-2, and 6C-3, the FE layer 210 is deposited on top and sidewall surfaces of each channel 204c (i.e., wraps around each channel 204c on three sides). The method 10 may perform annealing process(es) after depositing the FE layer 210 and before depositing the metal layer 212.

The metal layer 212 may include Mo, Ti, Pd, W, Co, Cr, Cu, Ni, Ta, Pt, Au, Al, TiW, TiN, TaN, WN, WCN, or other suitable conductive materials in various embodiments. The metal layer 212 is deposited to fill any remaining space between adjacent S/D metal electrodes 206 after the FE layer 210 is deposited. The metal layer 212 may be deposited using any suitable method(s), such as CVD, PVD, ALD, and/or plating. After the FE layer 210 and the metal layer 212 are deposited, the method 10 performs a planarization process such as a chemical mechanical planarization (CMP) process to the metal layer 212 and the FE layer 210 to expose the semiconductor layer 204b. The semiconductor layer 204b may be used as a CMP etch stop. The remaining portions of the metal layer 212 are also referred to as metal gates 212 or metal gate electrodes 212.

As depicted in FIGS. 6A, 6B, 6C-1, 6C-2, and 6C-3, an FeFET 225 is formed with a channel 204c, an FE layer 210, two S/D metal electrodes 206 connected by the channel 204c, and a metal gate 212, where the metal gate 212 is formed the last among these elements. By forming the metal gates 212 the last, the present disclosure reduces the number of thermal processes (such as the various annealing processes discussed above) that the metal gates 212 would have undergone. This advantageously improves the reliability and predictability of the threshold voltage (Vt) of the FeFET 225.

As shown in FIGS. 6C-1, 6C-2, and 6C-3, the FE layer 210 is disposed on top and sidewall surfaces of the channel 204c, and the gate electrode 212 is also disposed on top and sidewall surfaces of each channel 204c (i.e., wraps around each channel 204c on three sides), forming a tri-gate. This advantageously increases the effective channel width (which is the total length of the three sides of the channel 204c in FIGS. 6C-1~3 that are in contact with the FE layer 210) of the FeFET 225 and increases the current drive and/or source capability of the FeFET 225. Further, the channel 204c may be of various shapes, such as having a square cross-section (FIG. 6C-1), a rectangular cross-section (FIG. 6C-2), a semi-oval cross-section (FIG. 6C-3), or other suitable shapes. The FE layer 210 and the channels 204c are disposed directly on the isolation layer 202.

Figure 7B:
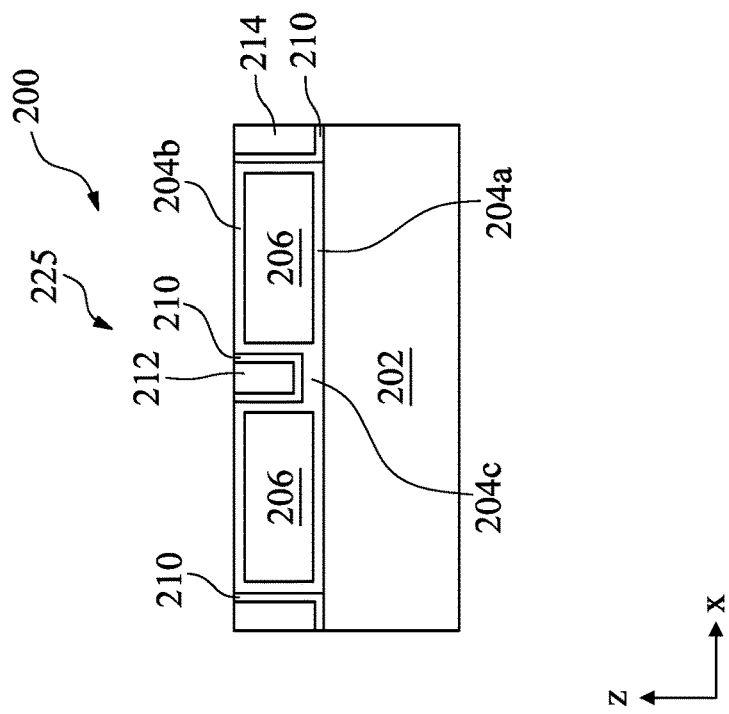
Figure 7A:
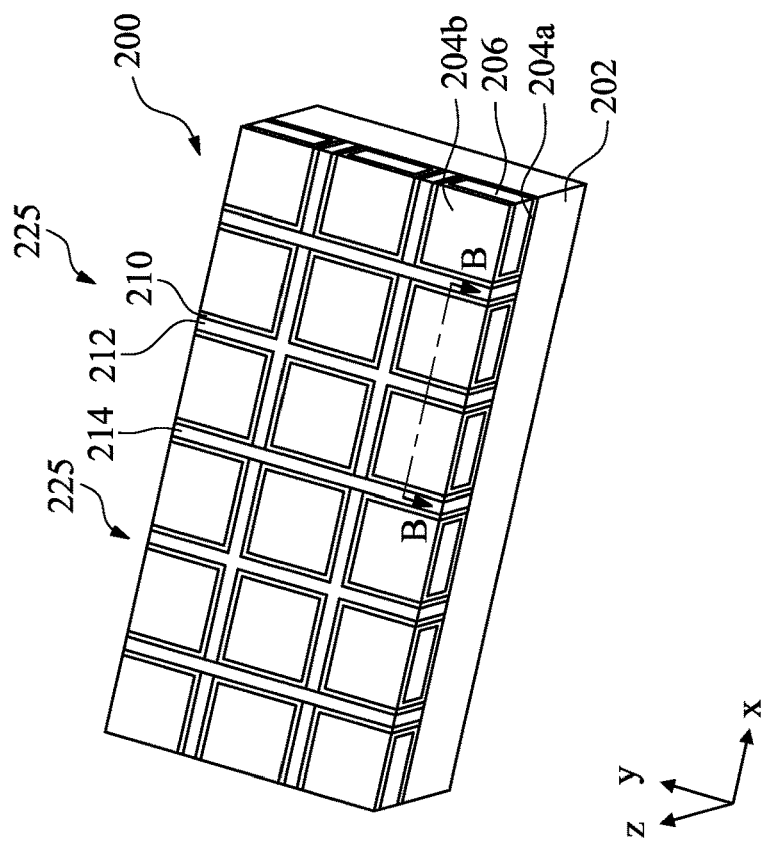

At operation 22, the method 10 (FIG. 1A) forms an isolation structure 214 to isolate certain FeFETs 225, an embodiment of which is shown in FIGS. 7A-7B. This involves a variety of processes including etching, deposition, and planarization. For example, operation 22 may perform a photolithography process to form an etch mask over the semiconductor structure 200, like that discussed above with reference to operation 14. The etch mask covers portions of the semiconductor structure 200 and expose certain portions of the metal gates 212. After the etch mask is formed, operation 22 applies one or more etching processes that selectively etch the metal gates 212 with minimal (to no) etching of the FE layer 210. In an embodiment, the various etching processes may include dry etching, wet etching, reactive ion etching, and/or other suitable processes. After the etching is finished, the etch mask is removed. The etching process(es) results in isolation trenches between adjacent FeFETs 225. Subsequently, operation 22 deposits one or more isolation materials into the isolation trenches and perform a CMP process to the one or more isolation materials to expose the top surface of the semiconductor layer 204b. The semiconductor layer 204b may be used as a CMP etch stop. Portions of the one or more isolation materials remain in the isolation trenches and become the isolation structure 214. In an embodiment, the isolation structure 214 may include silicon oxide ($SiO_2$), silicon nitride ($Si_3N_4$), silicon oxynitride (SiON), silicon oxycarbonitride (SiOCN), fluoride-doped silicate glass (FSG), a low-k dielectric material, and/or other suitable insulating material. In embodiments, the isolation structure 214 and the isolation layer 202 may include the same material or different materials.

Figure 8B:
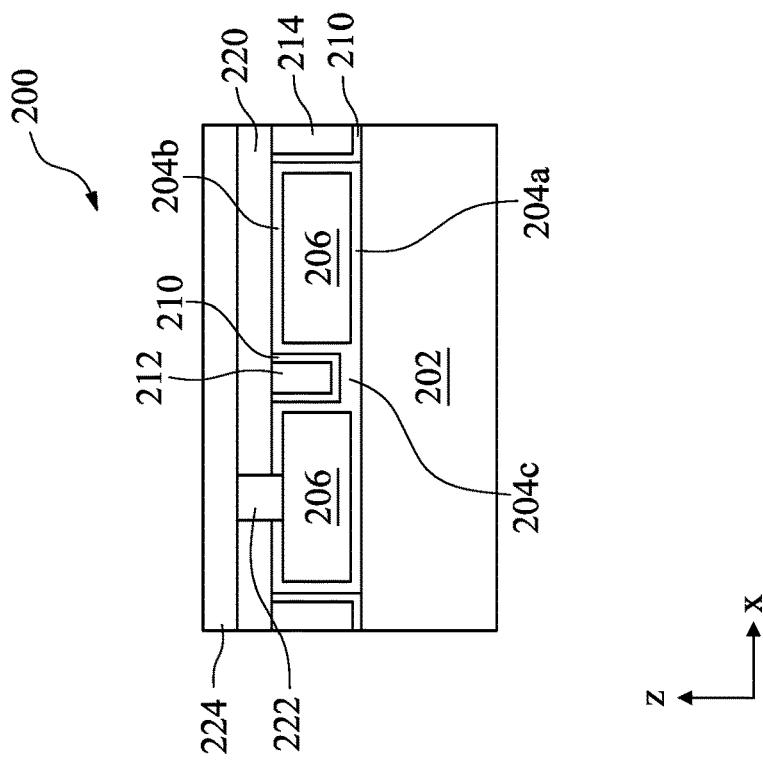
Figure 8A:
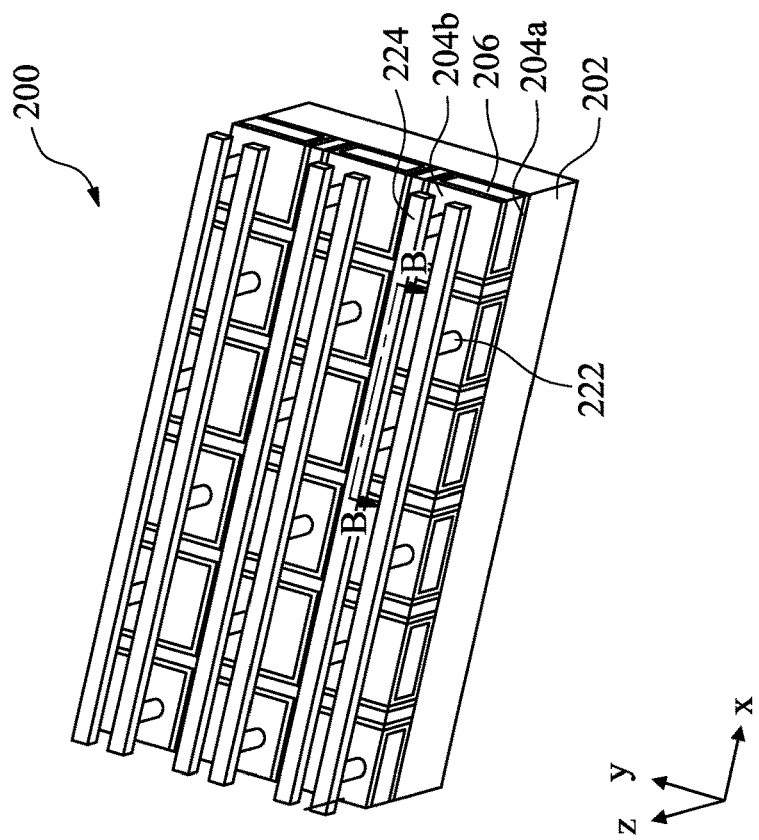

At operation 24, the method 10 (FIG. 1A) forms metal vias 222 and metal lines 224 that are electrically connected to the S/D metal electrodes 206, such as shown in FIGS. 8A-8B. This involves a variety of processes. In an embodiment, operation 24 forms an isolation layer 220 over the isolation structure 214, the gate electrodes 212, the semiconductor layer 204b, and the FE layer 210, such as shown in FIG. 8B. The isolation layer 220 is not shown in FIG. 8A for simplicity. In an embodiment, the isolation layer 220 is also disposed between the metal lines 224 and laterally isolates metal lines 224 one from another along the "y" direction. The isolation layer 220 may include $Si_3N_4$, $SiO_2$, SiCN, SiC, SiON, SiOCN, fluoride-doped silica glass, carbon doped silicon oxide, Xerogel, Aerogel, amorphous fluorinated carbon, Parylene, Benzocyclobutene (BCB), polyimide, other suitable dielectric material, or a combination thereof. In embodiments, the isolation structure 214 and the isolation layer 220 may include the same material or different materials. After forming the isolation layer 220, operation 24 may form the vias 222 and the metal lines 224 in the isolation layer 220 using damascene, dual damascene, or other suitable processes including etching, deposition, and CMP. For example, operation 24 may form line trenches and via holes in the isolation layer 220 by using photolithography and etching processes, deposit one or more metals into the line trenches and via holes, and perform a CMP process to the one or more metals. Portions of the one or more metals remain in the via holes become the vias 222, and portions of the one or more metals remain in the line trenches become the metal lines 224. In an embodiment, the vias 222 and the metal lines 224 may include Mo, Ti, Pd, W, Co, Cr, Cu, Ni, Ta, Pt, Au, Al, TiW, TiN, TaN, WN, WCN, other suitable metals, or a combination thereof. The vias 222 and the metal lines 224 may include the same metal(s) or different metals. As shown in FIGS. 8A-8B, the vias 222 are disposed directly on S/D metal electrodes 206 and serve as electrical connectors between the metal lines 224 and the S/D metal electrodes 206. The metal lines 224 may function as bit lines (BL) and/or source lines (SL) in a memory array having FeFET 225 as memory cells. The method 10 (FIG. 1A) may perform further fabrication, such as forming interconnect layers above the metal lines 224, forming passivation layer(s), and so on.

Figures 1, 9B:
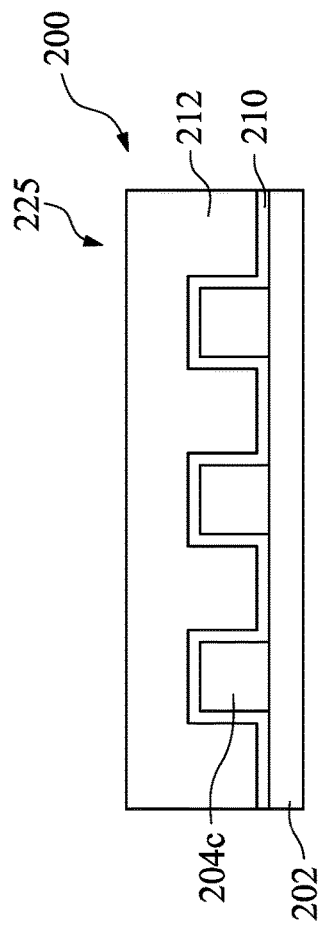
Figures 2, 9B:
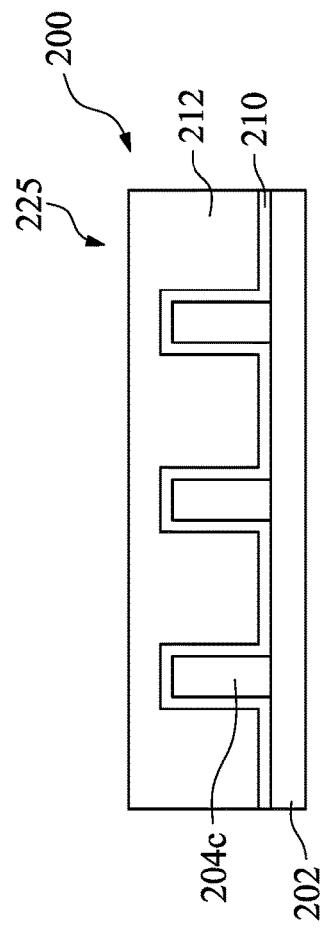
Figures 3, 9B:
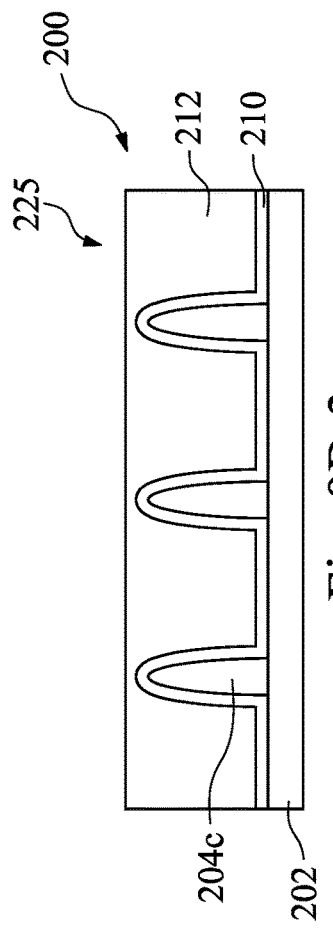
Figure 9A:
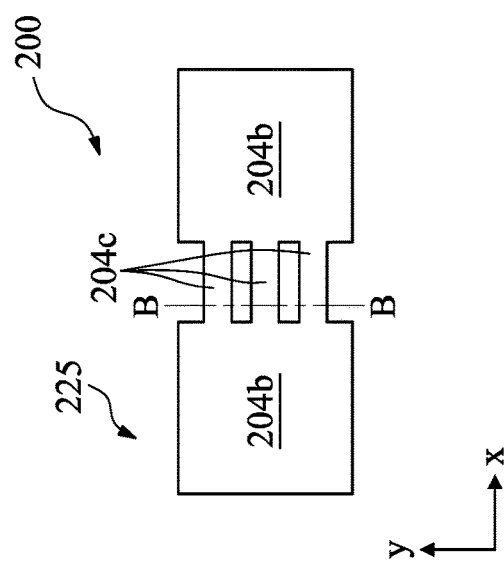
FIG. 9A illustrates a top view of a semiconductor structure having FeFET, in portion, according to various aspects of the present disclosure.

In some embodiments, an FeFET 225 may include multiple channels 204c between two S/D metal electrodes 206 to further increase the effective channel width. FIGS. 9A, 9B-1, 9B-2, and 9B-3 illustrate embodiments where FeFET 225 includes three channels 204c between two S/D metal electrodes 206. In various embodiments, FeFET 225 may include one, two, three, four, or more than four channels 204c. FIG. 9A illustrates a top view of a portion of an FeFET 225. The S/D metal electrodes 206 (not shown) are below the semiconductor layer 204b. FIGS. 9B-1, 9B-2, and 9B-3 illustrate cross-sectional views of the FeFET 225 along the "B-B" line in FIG. 9A. FIG. 9B-1 illustrates an embodiment of the FeFET 225 where each of the channels 204c has a square cross-section. FIG. 9B-2 illustrates an embodiment of the FeFET 225 where each of the channels 204c has a rectangular cross-section. FIG. 9B-3 illustrates an embodiment of the FeFET 225 where each of the channels 204c has a semi-oval cross-section. In each of the embodiments, the FE layer 210 is disposed on top and sidewalls of each channel 204c, and the gate electrode 212 is also disposed on top and sidewalls of each channel 204c and on the FE layer 210. Also, the channels 204c and the FE layer 210 are disposed on the isolation layer 202.

Figure 10B:
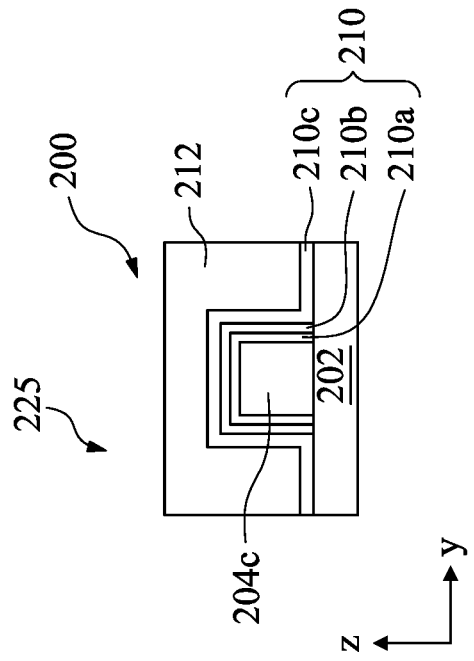
FIGS. 10A and 10B illustrate cross-sectional views of a semiconductor structure having FeFET, in portion, along the "C-C" line in FIG. 6A, according to various aspects of the present disclosure.
Figure 10A:
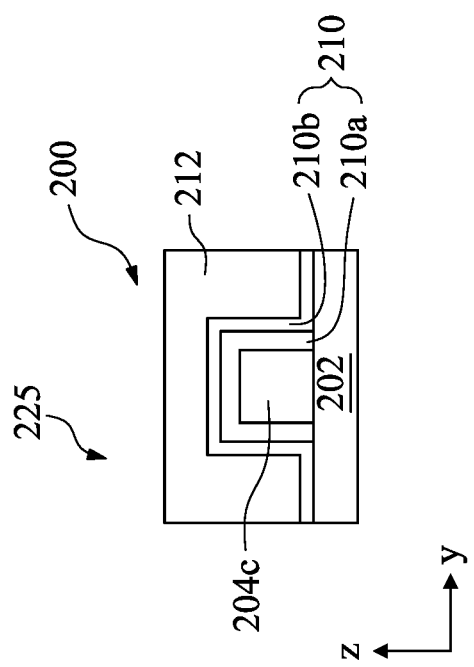

In some embodiments, an FeFET 225 may include multiple FE layers 210 or the FE layer 210 of an FeFET 225 may include multiple sub-layers and each sub-layer includes an FE material. This is illustrated in FIGS. 10A and 10B, which show cross-sectional view of the semiconductor structure 200, in portion, cut along the "C-C" line of FIG. 6A according to some embodiments. FIG. 10A illustrates an embodiment where the FE layer 210 in an FeFET 225 includes two sub-layers 210a and 210b. The sub-layer 210a is disposed on top and sidewalls of the channel 204c and is not disposed on the top surface of the isolation layer 202 (except the portion on the sidewalls of the channel 204c). The sub-layer 210b is disposed on the sub-layer 210a, on top and sidewalls of the channel 204c, and on the top surface of the isolation layer 202. The sub-layers 210a and 210b include different FE materials in this embodiment. FIG. 10B illustrates an embodiment where the FE layer 210 in an FeFET 225 includes three sub-layers 210a, 210b, and 210c. The sub-layers 210a and 210b are disposed on top and sidewalls of the channel 204c and are not disposed on the top surface of the isolation layer 202 (except the portion on the sidewalls of the channel 204c). The sub-layer 210b is disposed on the sub-layer 210a. The sub-layer 210c is disposed on the sub-layer 210b, on top and sidewalls of the channel 204c, and on the top surface of the isolation layer 202. The sub-layers 210a, 210b, and 210c include different FE materials in this embodiment. Having multiple FE layers between the channel 204c and the gate electrode 212 help stabilize ferroelectric switching.

Figure 11A:
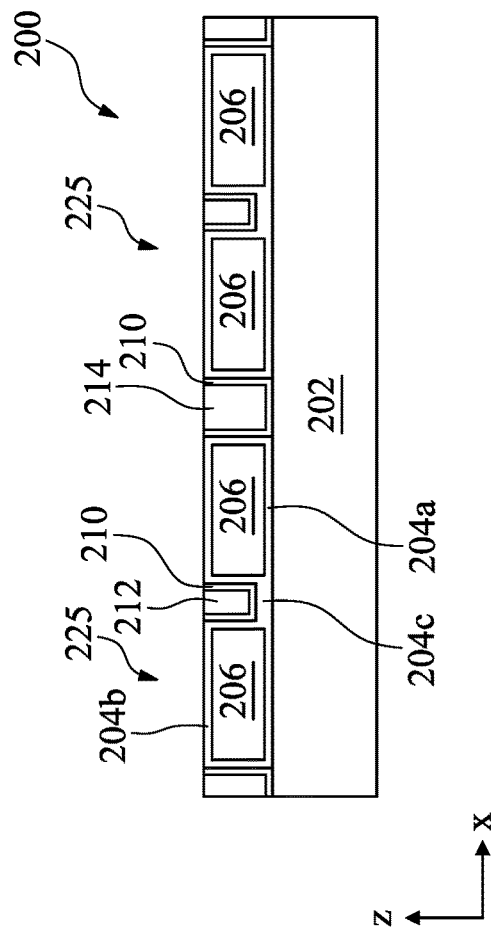
FIGS. 11A, 11B, 12A, 12B, 13A, 13B, and 14A illustrate cross-sectional views of a semiconductor structure having FeFET, in portion, along the "B-B" line in FIG. 6A, according to various aspects of the present disclosure.
Figure 11B:
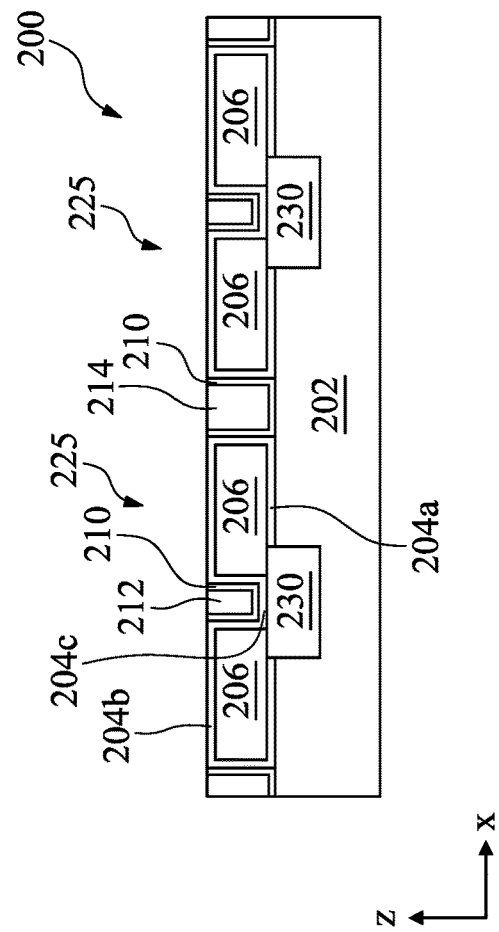

In an embodiment, such as shown in FIG. 11A, each FeFET 225 includes two S/D metal electrodes 206 and does not share a common source or drain with neighboring FeFETs. The individual FeFETs 225 are isolated from other by the isolation structure 214. In a further embodiment, such as shown in FIG. 11B, each FeFET 225 further includes an assist gate (AG) 230 directly below the channel 204c and the gate electrode 212. In an embodiment, the assist gate 230 and the gate electrode 212 of an FeFET 225 can be independently turned on or off, which helps controlling the memory states of the respective FeFET 225.

Figure 12A:
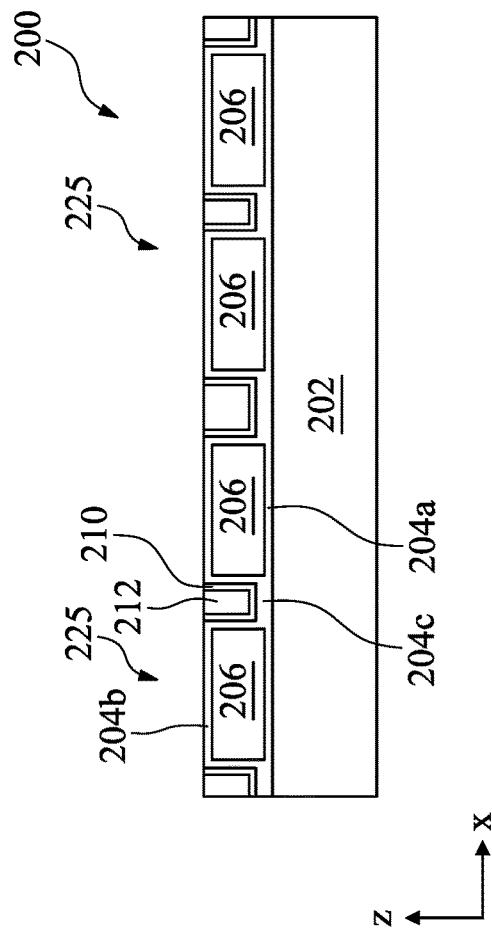
Figure 12B:
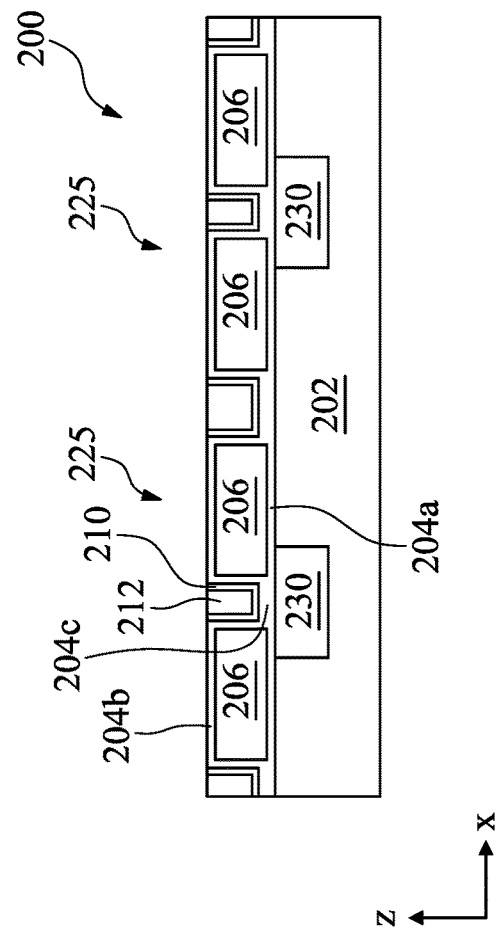

In an embodiment, such as shown in FIG. 12A, each FeFET 225 includes two S/D metal electrodes 206 and does not share a common source or drain with neighboring FeFETs. The individual FeFETs are not isolated one from another but interconnected by the gate electrode 212 (i.e., sharing a common gate electrode 212). In a further embodiment, such as shown in FIG. 12B, each FeFET 225 further includes an assist gate (AG) 230 directly below the channel 204c and the gate electrode 212. In an embodiment, the assist gates 230 and the gate electrode 212 can be independently turned on or off, which helps controlling the memory states of the FeFET 225.

Figure 13A:
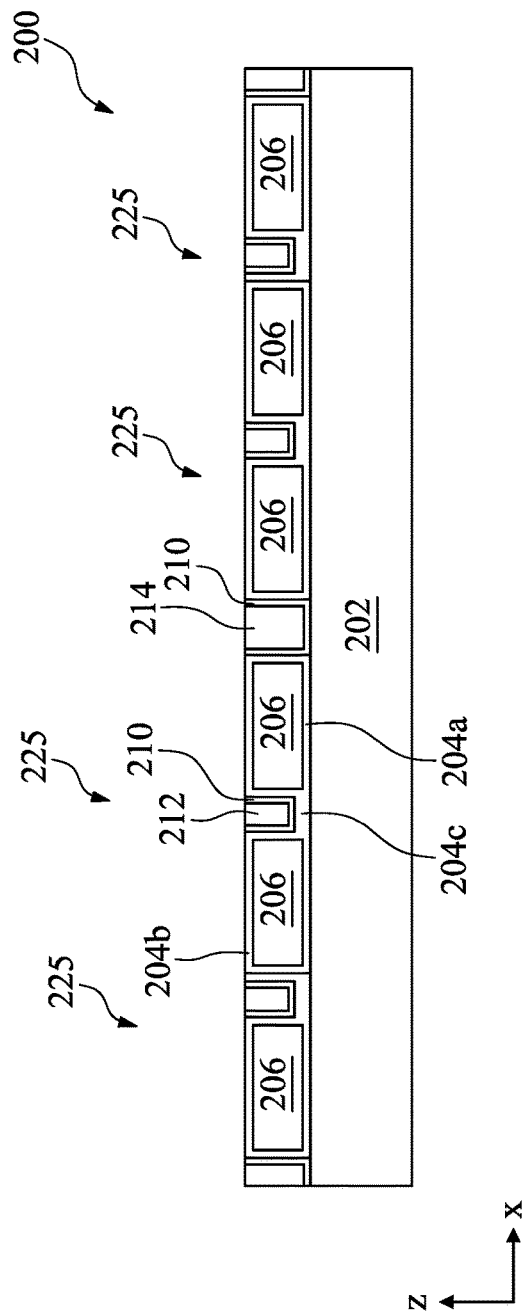
Figure 13B:
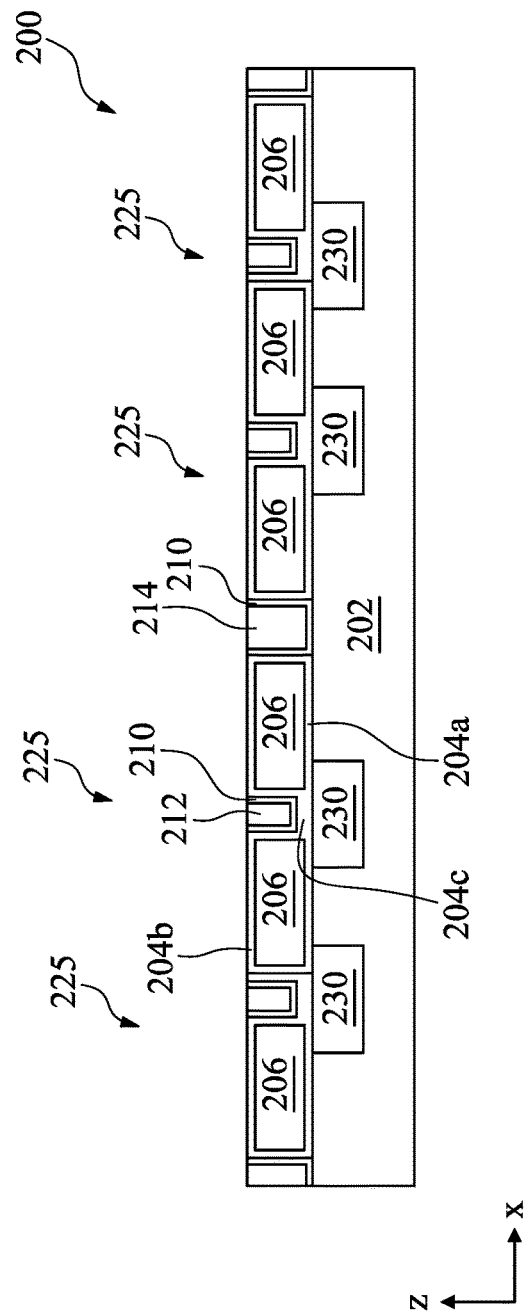

In an embodiment, such as shown in FIG. 13A, each FeFET 225 includes two S/D metal electrodes 206, and two neighboring FeFETs 225 share a common S/D metal electrode 206. For example, the two FeFETs 225 on the left in FIG. 13 share a common (middle) S/D metal electrode 206, and the two FeFETs 225 on the right in FIG. 13 share a common (middle) S/D metal electrode 206. Further, the two FeFETs 225 on the left in FIG. 13 share a common gate electrode 212, and the two FeFETs 225 on the right in FIG. 13 share a common gate electrode 212. In an embodiment, the shared S/D metal electrode 206 is connected to a bit line (an embodiment of metal line 224) and the two S/D metal electrodes 206 on the left and right of the shared S/D metal electrode 206 are connected to source lines (an embodiment of metal line 224). In another embodiment, the shared S/D metal electrode 206 is connected to a source line (an embodiment of metal line 224) and the two S/D metal electrodes 206 on the left and right of the shared S/D metal electrode 206 are connected to bit lines (an embodiment of metal line 224). In a further embodiment, such as shown in FIG. 13B, each FeFET 225 further includes an assist gate (AG) 230 directly below the channel 204c and the gate electrode 212. In an embodiment, the assist gate 230 and the gate electrode 212 can be independently turned on or off, which helps controlling the memory states of the respective FeFET 225.

Figures 14A, 14B:
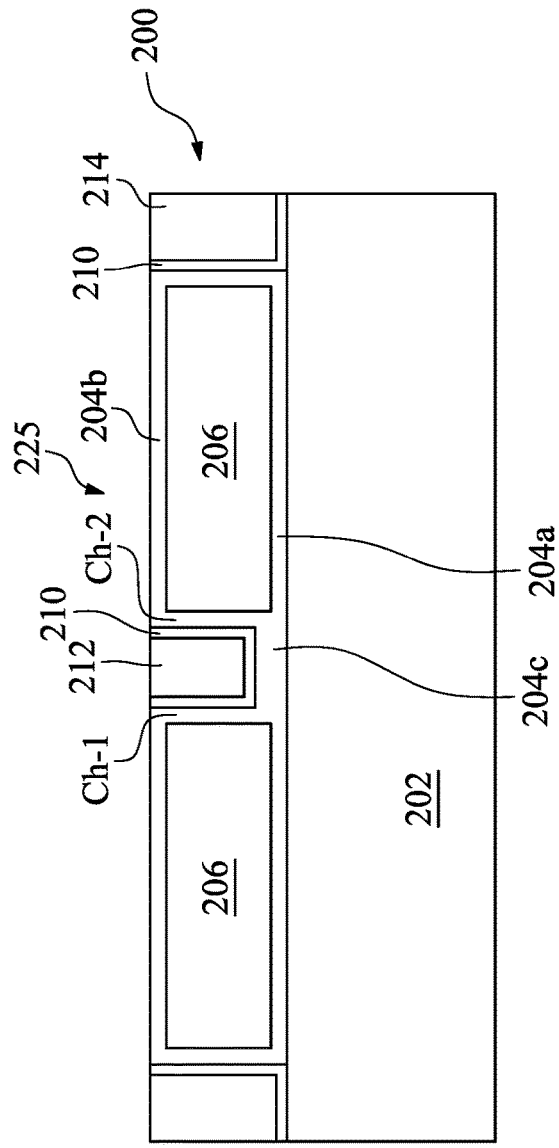
FIG. 14B illustrates an example application of the semiconductor structure in FIG. 14A, according to various aspects of the present disclosure.

FIGS. 14A and 14B illustrate an application of an FeFET 225 as a memory cell, according to an embodiment of the present disclosure. The structure of the FeFET 225 is the same as that shown in FIG. 7B. As shown in FIGS. 14A-14B, "ch-1" refers to the portion of the semiconductor layer 204b on the sidewall of the S/D metal electrode 206 on the left, and "ch-2" refers to the portion of the semiconductor layer 204b on the sidewall of the S/D metal electrode 206 on the right. The portions ch-1 and ch-2 vertically connect the channel 204c to the portions of the semiconductor layer 204b on the top surfaces of the S/D metal electrodes 206. The portions ch-1 and ch-2 can be independently controlled to achieve a polarization state (e.g., up or down), driven by the electric field in the FE layer 210, which is created by applying electric field between the electrodes (gate electrode 212 and the respective S/D metal electrodes 206). The polarization states in ch-1 and ch-2 can be utilized to make a 2-bit memory cell, providing 4 memory states, (1, 1), (1, 0), (0, 1), and (0, 0).

Figure 15B:
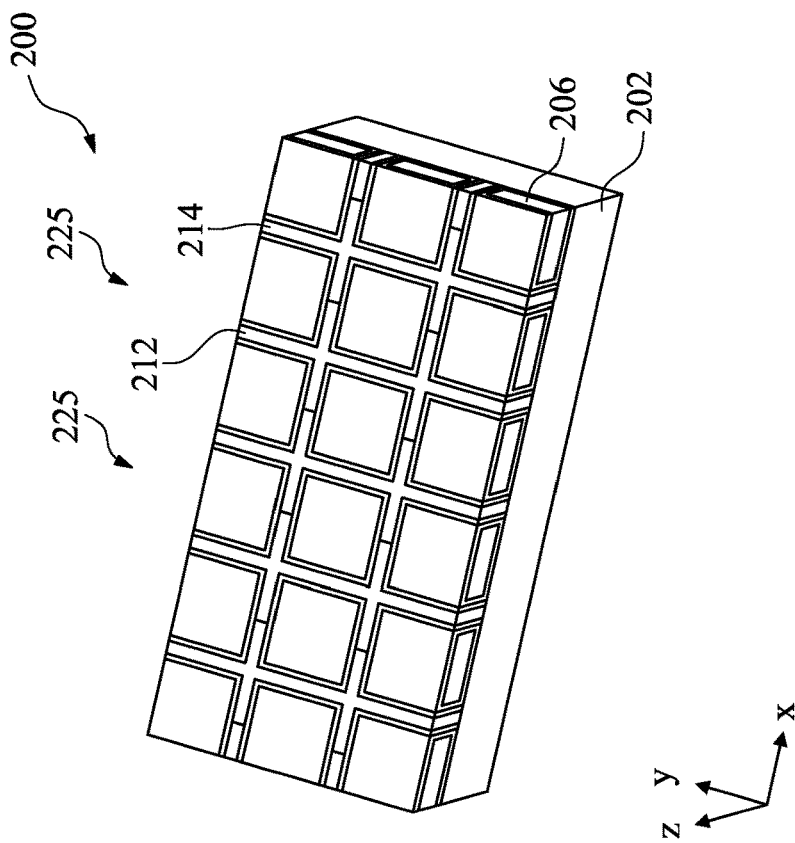
FIGS. 15A and 15B illustrate perspective views of a semiconductor structure having FeFET, in portion, according to various aspects of the present disclosure.
Figure 15A:
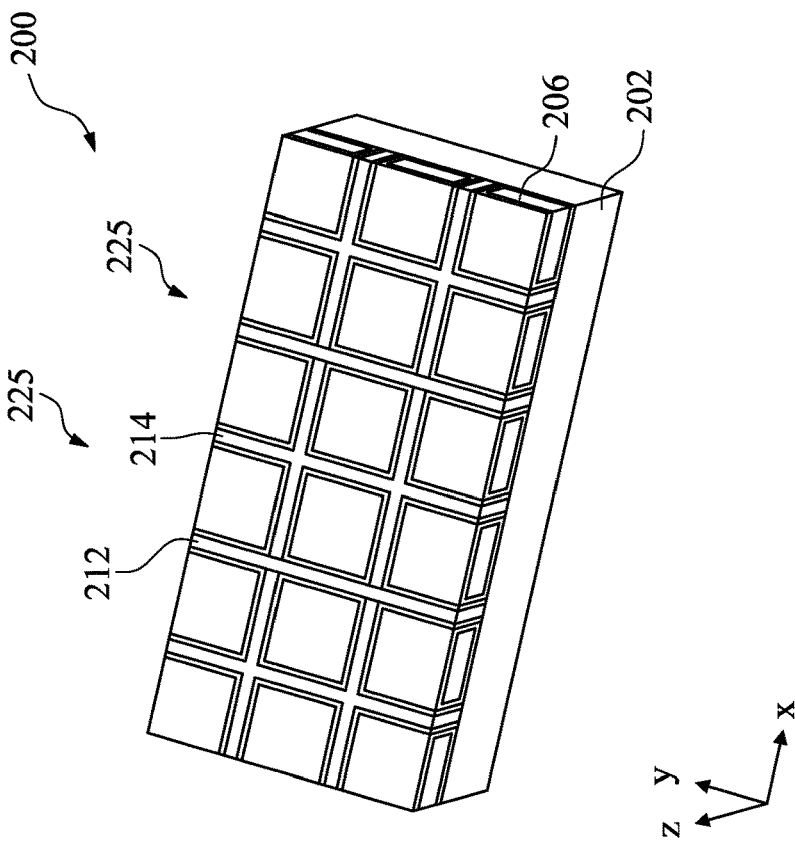

FIGS. 15A and 15B illustrate embodiments where the isolation structure 214 and the gate electrode 212 have different shapes than the embodiment in FIGS. 7A-7B. In FIG. 7A, each isolation structure 214 has a rectangular shape extending lengthwise along the "y" direction from a top view, and each gate electrode 212 has a rectangular shape extending lengthwise along the "y" direction and multiple rectangular shapes extending lengthwise along the "x" direction and reaching the adjacent isolation structures 214 from a top view.

In FIG. 15A, each gate electrode 212 has a rectangular shape extending lengthwise along the "y" direction from a top view, and each isolation structure 214 has a rectangular shape extending lengthwise along the "y" direction and multiple rectangular shapes extending lengthwise along the "x" direction and reaching the adjacent gate electrodes 212 from a top view.

In FIG. 15B, each isolation structure 214 has a rectangular shape extending lengthwise along the "y" direction and multiple rectangular shapes extending lengthwise along the "x" direction and reaching somewhere near the middle of the S/D metal electrodes 206 from a top view. Similarly, each gate electrode 212 has a rectangular shape extending lengthwise along the "y" direction and multiple rectangular shapes extending lengthwise along the "x" direction and reaching somewhere near the middle of the S/D metal electrodes 206 from a top view. The portions of the gate electrode 212 and the portions of the isolation structure 214 that extend lengthwise along the "x" direction meet each other.

When forming the isolation structure 214 in operation 22, the method 10 may remove the gate electrode 212 without etching the FE layer 210 and the semiconductor layer 204b in the isolation areas (e.g., between FeFETs), such as shown in FIGS. 7A-7B. Alternatively, the method 10 may also remove the FE layer 210 and/or portions of the semiconductor layer 204b in the isolation areas. Some of these embodiments are discussed with reference to FIGS. 16A, 16B, and 16C.

FIG. 16A illustrates an embodiment where the method 10 at operation 22 removes the gate electrode 212 and the FE layer 210, but not the semiconductor layer 204b, in the isolation areas. As a result, the isolation structure 214 directly contacts the semiconductor layer 204b on the sidewalls of the S/D metal electrodes 206 and directly contacts the isolation layer 202. Other aspects of this embodiment are the same as those of the embodiment shown in FIGS. 7A-7B.

FIG. 16B illustrates an embodiment where the method 10 at operation 22 removes the gate electrode 212 and the FE layer 210, as well as the portions of the semiconductor layer 204b on the sidewalls of the S/D metal electrodes 206, in the isolation areas. As a result, the isolation structure 214 directly contacts the sidewalls of the S/D metal electrodes 206 and directly contacts the isolation layer 202. Other aspects of this embodiment are the same as those of the embodiment shown in FIGS. 7A-7B.

FIG. 16C illustrates an embodiment where the method 10 at operation 22 removes the gate electrode 212, the FE layer 210, the portions of the semiconductor layer 204b on the sidewalls of the S/D metal electrodes 206, portions of the semiconductor layer 204b on the top surface of the S/D metal electrodes 206, and portions of the semiconductor layer 204a on the bottom surface of the S/D metal electrodes 206 in the isolation areas. As a result, the isolation structure 214 directly contacts the top surface, bottom surface, and sidewalls of the S/D metal electrodes 206, and directly contacts the isolation layer 202. Other aspects of this embodiment are the same as those of the embodiment shown in FIGS. 7A-7B.

Figure 17:
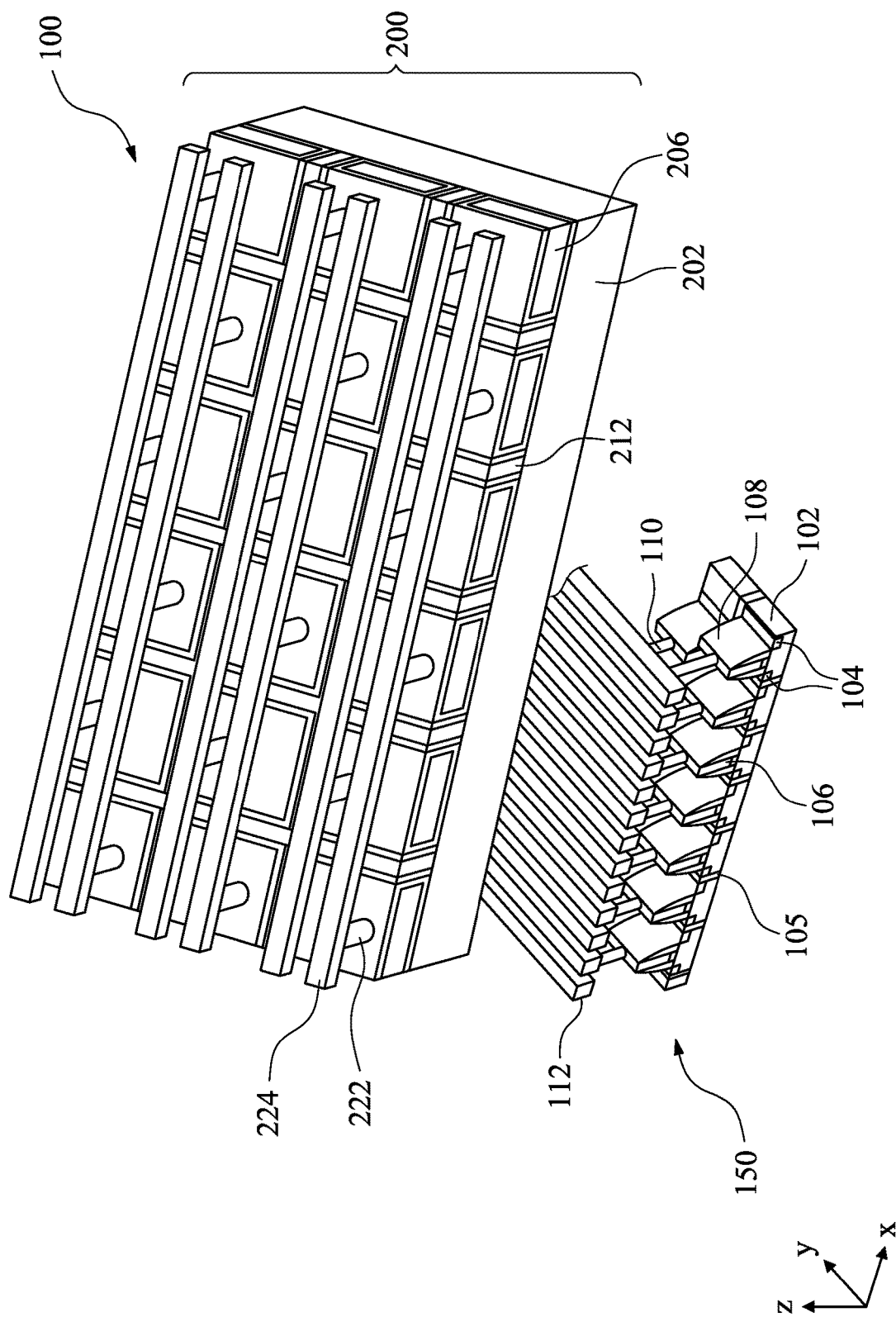
FIG. 17 illustrates a perspective view of a semiconductor structure having FeFET, in portion, according to various aspects of the present disclosure.

In some embodiments, the semiconductor structure 200 is a standalone device, such as a standalone memory IC. In some embodiments, the semiconductor structure 200 is integrated with other devices, such as CMOSFETs, on an IC. FIG. 17 illustrates such an embodiment. Referring to FIG. 17, the semiconductor structure 200 is integrated with transistors 150 in an IC 100. The transistors 150 are implemented in or on a substrate 102 and include source/drain regions 104, gate electrodes 106, and gate spacers 108. The transistors 150 are isolated one from another by an isolation structure (such as shallow trench isolation STI) 105. The transistors 150 may be planar MOS transistors, FinFET, gate-all-around (GAA) transistors, or other types of transistors. In the embodiment shown in FIG. 17, word lines (WL) 112 are connected to the gate electrodes 212 from under the semiconductor structure 200. In another embodiment, the WL 112 are connected to the gate electrodes 212 from above the semiconductor structure 200. In the embodiment depicted in FIG. 17, the WL 112 are further connected to gate vias 110 disposed over gate electrodes 106 of various transistors 150. In the embodiment shown in FIG. 17, the semiconductor structure 200 may be implemented at the $N^{th}$ interconnect layer (or metal layer) of the IC 100 above the transistors 150, where N is a natural number. For example, the semiconductor structure 200 may be implemented at the $4^{th}$ interconnect layer of the IC 100 (in other words, the semiconductor structure 200 may be implemented between the $3^{rd}$ and the $5^{th}$ interconnect layers of the IC 100). The transistors 150 may be used to implement read and write logic for accessing memory cells (formed of FeFETs 225) in the semiconductor structure 200. In that regard, the transistors 150 may be interconnected with the first and the second S/D metal electrodes 206 and/or the gate electrodes 212.

The present disclosure provides various embodiments as discussed above. Features from different embodiments may be combined to form additional embodiments of the present disclosure. Although not intended to be limiting, embodiments of the present disclosure provide one or more of the following advantages. For example, embodiments of the present disclosure form gate electrodes in FeFETs using a gate-last process, which reduces thermal impacts on FeFET threshold voltage (Vt) and increase the reliability of the manufacturing processes. For another example, embodiments of the present disclosure employ a tri-gate structure (i.e., having an gate electrode disposed on top and sidewall surfaces of a channel), which increases effective channel width of the FeFETs. Further, in some embodiments of the present disclosure, a semiconductor layer is disposed around (such as fully wrapping around) S/D metal electrodes and provides FeFET channels, which reduces S/D to channel contact resistance and enhances FeFET's current drive and/or source capability.

In one example aspect, the present disclosure is directed to a semiconductor structure that includes an isolation layer; first and second source/drain (S/D) metal electrodes over the isolation layer; a metal gate disposed laterally between the first and the second S/D metal electrodes; a ferroelectric layer on a bottom surface and sidewall surfaces of the metal gate; and an oxide semiconductor layer. The oxide semiconductor layer includes a first portion under the first and the second S/D metal electrodes; a second portion under the ferroelectric layer and being thicker than the first portion; third portions above the first and the second S/D metal electrodes, respectively; and fourth portions on sidewalls of the first and the second S/D metal electrodes, respectively, and connecting the third portions to the second portion.

In an embodiment of the semiconductor structure, each of the first and the second S/D metal electrodes includes Mo, Ti, Pd, W, Co, Cr, Cu, Ni, Ta, Pt, Au, Al, TiW, TiN, TaN, WN, or WCN. In another embodiment, the metal gate includes Mo, Ti, Pd, W, Co, Cr, Cu, Ni, Ta, Pt, Au, Al, TiW, TiN, TaN, WN, or WCN.

In an embodiment of the semiconductor structure, the ferroelectric layer includes $Hf_{1-x}Zr_xO_2$, $BaMgF_4$, $BaTiO_3$—$PbZrO$, $(Ba,Sr)TiO_3$, $Bi_4Ti_3O_{12}$, $LiNbO_3$, $LiTaO_3$, $(Pb,La)TiO_3$, $(Pb,La)(Zr,Ti)O_3$, $Pb(Zr,Ti)O_3$, $SrBi_2Ta_2O_9$, $Bi_{4-x}La_xTi_3O_{12}$, $BiFeO_3$, $YMnO_3$, $YbMnO_3$, $BiMnO_3$, $Pb(Fe_{0.5}W_{0.5})_3$, or $HfO_2$. In some embodiments, the oxide semiconductor layer includes amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO), $SnO_x$, $Cu_xO$, or $NiO_x$.

In an embodiment of the semiconductor structure, the ferroelectric layer and the metal gate are disposed on top and sidewall surfaces of the second portion of the oxide semiconductor layer. In a further embodiment, the second portion of the oxide semiconductor layer is in a shape of a square or a rectangle in a cross-sectional view cut perpendicular to a direction from the first S/D metal electrode to the second S/D metal electrode. In another further embodiment, the second portion of the oxide semiconductor layer is in a shape of a semi-oval in a cross-sectional view cut perpendicular to a direction from the first S/D metal electrode to the second S/D metal electrode.

In an embodiment, the semiconductor structure further includes a first via disposed on the first S/D metal electrode; a second via disposed on the second S/D metal electrode; a first metal line disposed on the first via and extending lengthwise along a first direction from the first S/D metal electrode to the second S/D metal electrode; and a second metal line disposed on the second via and extending lengthwise along the first direction. In a further embodiment, the first and the second S/D metal electrodes, the first and the second vias, and the first and the second metal lines include a same metal. In another further embodiment, the first and the second S/D metal electrodes include a different metal than the first and the second vias and the first and the second metal lines.

In some embodiments, the semiconductor structure further includes transistors below the isolation layer wherein the transistors are interconnected with the first and the second S/D metal electrodes and the metal gate.

In another example aspect, the present disclosure is directed to a semiconductor structure that includes an isolation layer; first and second source/drain (S/D) metal electrodes over the isolation layer; and an oxide semiconductor layer, wherein a first portion of the oxide semiconductor layer is disposed between the first and the second S/D metal electrodes and connects the first and the second S/D metal electrodes. The semiconductor structure further includes a ferroelectric layer disposed on top and sidewall surfaces of the first portion of the oxide semiconductor layer and a metal gate disposed laterally between the first and the second S/D metal electrodes, on the ferroelectric layer, and on the top and sidewall surfaces of the first portion of the oxide semiconductor layer.

In an embodiment of the semiconductor structure, the oxide semiconductor layer further includes second portions on bottom surfaces of the first and the second S/D metal electrodes, third portions on top surfaces of the first and the second S/D metal electrodes, and fourth portions on sidewall surfaces of the first and the second S/D metal electrodes. In a further embodiment, the first portion is thicker than each of the second portions, the third portions, and the fourth portions.

In an embodiment, the semiconductor structure further includes first and second vias disposed on the first and the second S/D metal electrodes, respectively, and first and second metal lines disposed on the first and the second vias, respectively. In a further embodiment, the semiconductor structure further includes transistors below the isolation layer.

In yet another example aspect, the present disclosure is directed to a method. The method includes providing a stack of layers including an isolation layer, a first oxide semiconductor layer over the isolation layer, and a first metal layer over the first oxide semiconductor layer; patterning the first metal layer to form source/drain metal electrodes; and depositing a second oxide semiconductor layer directly on the first oxide semiconductor layer and the source/drain metal electrodes. The method further includes patterning the first and the second oxide semiconductor layers to form oxide semiconductor channel layers; depositing a ferroelectric layer on at least top and sidewall surfaces of the oxide semiconductor channel layers; depositing a metal gate layer over the ferroelectric layer; and performing a planarization process to the metal gate layer and the ferroelectric layer to expose the second oxide semiconductor layer.

In an embodiment, the method further includes replacing portions of the metal gate layer with an isolation material. In a further embodiment, the method includes forming metal vias connecting to the source/drain metal electrodes and forming metal lines over and connecting to the metal vias.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    an isolation layer;
    first and second source/drain (S/D) metal electrodes over the isolation layer;
    a metal gate disposed laterally between the first and the second S/D metal electrodes;
    a ferroelectric layer on a bottom surface and sidewall surfaces of the metal gate; and
    an oxide semiconductor layer, comprising:
        a first portion under the first and the second S/D metal electrodes;
        a second portion under the ferroelectric layer and being thicker than the first portion;
        third portions above the first and the second S/D metal electrodes, respectively; and
        fourth portions on sidewalls of the first and the second S/D metal electrodes, respectively, and connecting the third portions to the second portion.

2. The semiconductor structure of claim 1, wherein each of the first and the second S/D metal electrodes includes Mo, Ti, Pd, W, Co, Cr, Cu, Ni, Ta, Pt, Au, Al, TiW, TiN, TaN, WN, or WCN.

3. The semiconductor structure of claim 1, wherein the metal gate includes Mo, Ti, Pd, W, Co, Cr, Cu, Ni, Ta, Pt, Au, Al, TiW, TiN, TaN, WN, or WCN.

4. The semiconductor structure of claim 1, wherein the ferroelectric layer includes $Hf_{1-x}Zr_xO_2$, $BaMgF_4$, $BaTiO_3$—$PbZrO$, $(Ba,Sr)TiO_3$, $Bi_4Ti_3O_{12}$, $LiNbO_3$, $LiTaO_3$, $(Pb,La)TiO_3$, $(Pb,La)(Zr,Ti)O_3$, $Pb(Zr,Ti)O_3$, $SrBi_2Ta_2O_9$, $Bi_{4-x}La_xTi_3O_{12}$, $BiFeO_3$, $YMnO_3$, $YbMnO_3$, $BiMnO_3$, $Pb(Fe_{0.5}W_{0.5})_3$, or $HfO_2$.

5. The semiconductor structure of claim 1, wherein the oxide semiconductor layer includes amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO), $SnO_x$, $Cu_xO$, or $NiO_x$.

6. The semiconductor structure of claim 1, wherein the ferroelectric layer and the metal gate are disposed on top and sidewall surfaces of the second portion of the oxide semiconductor layer.

7. The semiconductor structure of claim 6, wherein the second portion of the oxide semiconductor layer is in a shape of a square or a rectangle in a cross-sectional view cut perpendicular to a direction from the first S/D metal electrode to the second S/D metal electrode.

8. The semiconductor structure of claim 6, wherein the second portion of the oxide semiconductor layer is in a shape of a semi-oval in a cross-sectional view cut perpendicular to a direction from the first S/D metal electrode to the second S/D metal electrode.

9. The semiconductor structure of claim 1, further comprising:
    a first via disposed on the first S/D metal electrode;
    a second via disposed on the second S/D metal electrode;
    a first metal line disposed on the first via and extending lengthwise along a first direction from the first S/D metal electrode to the second S/D metal electrode; and
    a second metal line disposed on the second via and extending lengthwise along the first direction.

10. The semiconductor structure of claim 9, wherein the first and the second S/D metal electrodes, the first and the second vias, and the first and the second metal lines include a same metal.

11. The semiconductor structure of claim 9, wherein the first and the second S/D metal electrodes include a different metal than the first and the second vias and the first and the second metal lines.

12. The semiconductor structure of claim 1, further comprising transistors below the isolation layer wherein the transistors are interconnected with the first and the second S/D metal electrodes and the metal gate.

13. A semiconductor structure, comprising:
    an isolation layer;
    first and second source/drain (S/D) metal electrodes over the isolation layer;
    an oxide semiconductor layer, wherein a first portion of the oxide semiconductor layer is disposed between the first and the second S/D metal electrodes and connects the first and the second S/D metal electrodes;
    a ferroelectric layer disposed on top and sidewall surfaces of the first portion of the oxide semiconductor layer; and a metal gate disposed laterally between the first and the second S/D metal electrodes, on the ferroelectric layer, and on the top and sidewall surfaces of the first portion of the oxide semiconductor layer.

14. The semiconductor structure of claim 13, wherein the oxide semiconductor layer further includes:

second portions on bottom surfaces of the first and the second S/D metal electrodes;

third portions on top surfaces of the first and the second S/D metal electrodes; and fourth portions on sidewall surfaces of the first and the second S/D metal electrodes.

15. The semiconductor structure of claim 14, wherein the first portion is thicker than each of the second portions, the third portions, and the fourth portions.

16. The semiconductor structure of claim 13, further comprising:

first and second vias disposed on the first and the second S/D metal electrodes, respectively; and first and second metal lines disposed on the first and the second vias, respectively.

17. The semiconductor structure of claim 16, further comprising transistors below the isolation layer.

18. A method, comprising:

providing a stack of layers including an isolation layer, a first oxide semiconductor layer over the isolation layer, and a first metal layer over the first oxide semiconductor layer;

patterning the first metal layer to form source/drain metal electrodes;

depositing a second oxide semiconductor layer directly on the first oxide semiconductor layer and the source/drain metal electrodes;

patterning the first and the second oxide semiconductor layers to form oxide semiconductor channel layers;

depositing a ferroelectric layer on at least top and sidewall surfaces of the oxide semiconductor channel layers;

depositing a metal gate layer over the ferroelectric layer; and performing a planarization process to the metal gate layer and the ferroelectric layer to expose the second oxide semiconductor layer.

19. The method of claim 18, further comprising:

replacing portions of the metal gate layer with an isolation material.

20. The method of claim 19, further comprising:

forming metal vias connecting to the source/drain metal electrodes; and forming metal lines over and connecting to the metal vias.

* * * * *